United States Patent
Bacchus et al.

(10) Patent No.: US 7,327,612 B2
(45) Date of Patent: Feb. 5, 2008

(54) METHOD AND APPARATUS FOR PROVIDING THE PROPER VOLTAGE TO A MEMORY

(75) Inventors: Reza M. Bacchus, Spring, TX (US); Vincent Nguyen, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 5 days.

(21) Appl. No.: 11/047,196

(22) Filed: Jan. 31, 2005

(65) Prior Publication Data

US 2006/0171230 A1 Aug. 3, 2006

(51) Int. Cl.
*G11C 7/00* (2006.01)
(52) U.S. Cl. ............ 365/189.01; 365/226; 365/189.04
(58) Field of Classification Search .......... 365/189.01, 365/226
See application file for complete search history.

(56) References Cited

U.S. PATENT DOCUMENTS

| 4,597,058 | A | * | 6/1986 | Izumi et al. ................. 711/115 |
| 5,440,520 | A | * | 8/1995 | Schutz et al. ............... 365/226 |
| 5,790,952 | A | * | 8/1998 | Seazholtz et al. ......... 455/432.1 |
| 5,889,721 | A | * | 3/1999 | Gannage .................... 365/226 |
| 5,937,423 | A | * | 8/1999 | Robinson ..................... 365/52 |
| 6,134,638 | A |   | 10/2000 | Olarig et al. |
| 2001/0019510 | A1 | * | 9/2001 | Aue .......................... 365/222 |
| 2004/0148482 | A1 | * | 7/2004 | Grundy et al. .............. 711/167 |

* cited by examiner

*Primary Examiner*—Thong Q. Le

(57) ABSTRACT

A method includes querying a memory to determine what type of voltage the memory requires and applying the proper operating voltage to the memory based on the query. An apparatus that supports different memory types is also disclosed.

19 Claims, 2 Drawing Sheets

METHOD AND APPARATUS FOR PROVIDING THE PROPER VOLTAGE TO A MEMORY

BACKGROUND

Systems such as servers use onboard Random Access Memory (RAM) which can be added by plugging in one or more memory modules to the server's circuit board. Depending on a particular server's memory requirements, different amount or types of RAM is added.

Different memory technologies usually require different operating voltages to operate properly. Typically, with each generation of memory technology, the operating voltage of the memory drops due to design improvements.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
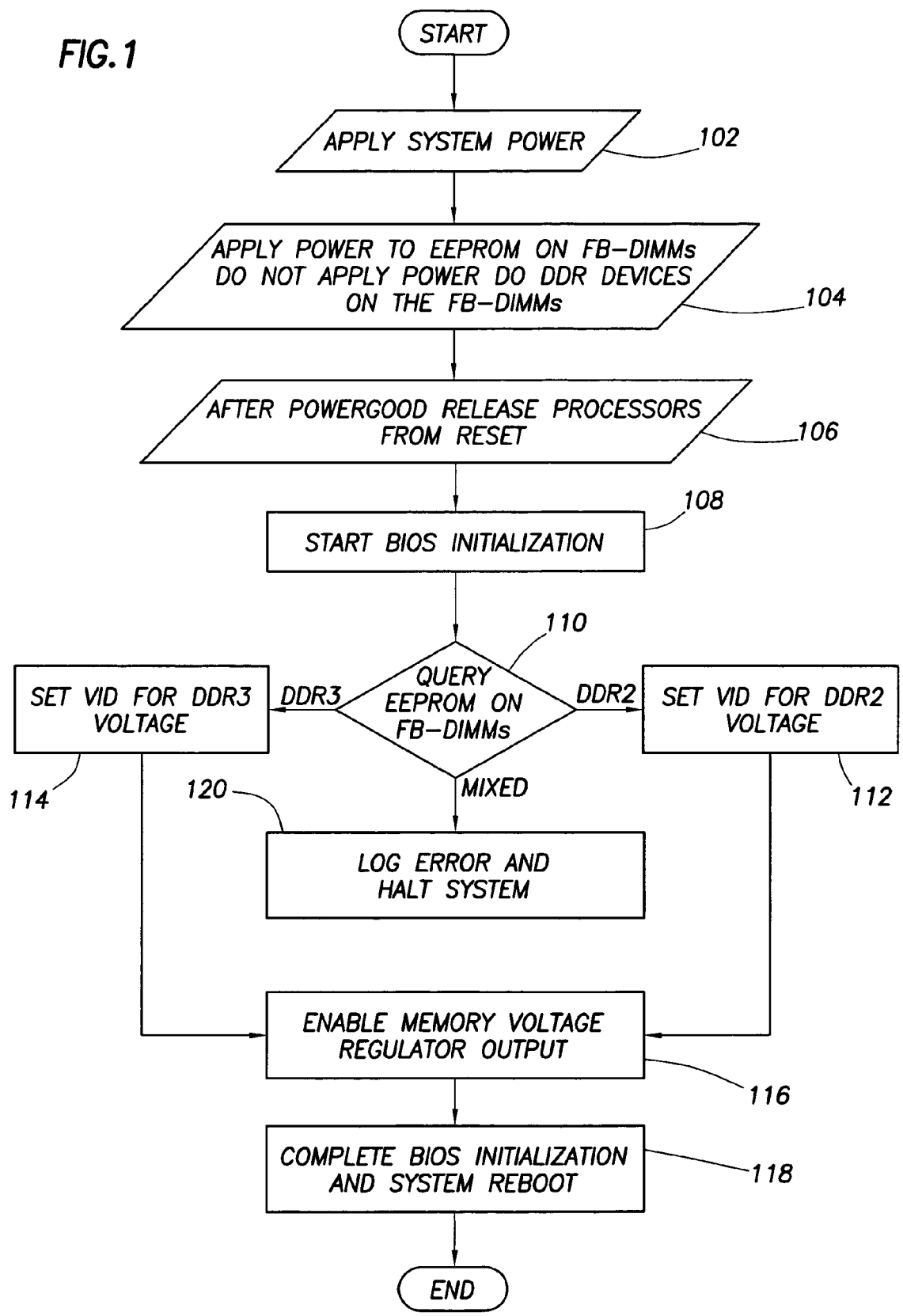
FIG. 1 shows a flowchart highlighting the actions for supporting different memory types in accordance with an embodiment of the invention.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

An electronic device such as a server in accordance with an embodiment of the invention will use memory modules such as Dual In-line Memory Modules (DIMMs) as the system memory. DIMMs can include Dynamic Random Access Memory (DRAM) devices. The DIMMs are plugged into sockets located in one of the server's circuit boards. The sockets are in turn coupled to a controller such as a memory controller directly or through a buffer.

In addition to RAM, DIMMs typically include a nonvolatile storage area such as an Electrically Erasable Programmable Read Only Memory (EEPROM) that has stored therein the feature set of the particular DIMM, including the memory technology of the memory devices such as DRAMS located on the DIMM, as well as bus speed information, etc. In some embodiments, this information is in accordance with a serial presence detect (SPD) standard. Such is described in U.S. Pat. No. 6,134,638 which is included herein by reference. In other embodiments instead of an EEPROM other types of memory can also be used. The EEPROM is separate from the DRAM memory devices and is powered from a voltage rail that is different from the voltage rail used to power the DRAM devices, since the EEPROM requires a different operating voltage. Prior to configuring the memory controller, the system queries the EEPROM on each DIMM to determine how the memory controller should be configured; these queries are transmitted using a serial system management interface in such embodiments.

As the operating speed of DRAMs has increased over the years, fewer and fewer DIMMs are supported on the DDR bus due to capacitance issues which causes a problem when additional memory capacity is required. A Fully Buffered DIMM (FB-DIMM) is currently being developed through EDEC Solid State Technology Association (once known as Joint Electron Device Engineering Council) to solve the memory capacity issue. FB-DIMM is an evolution of the DIMM in which an Advanced Memory Buffer (AMB) integrated circuit is placed on the DIMM between the card edge interface and the DRAM device. The AMB provides a serial interface to the server's memory controller through a connector, and a parallel interface to the DRAM devices located on the DIMM. The parallel interface is not exposed to the memory controller.

Referring to FIG. 1, there is shown a flowchart of actions taken in order to support different memory types in a server in accordance with one embodiment of the invention. In the illustrative example, the method shown in FIG. 1 supports a first memory type such as DRAM Double Data Rate 2 (DDR2) and a second memory type such as DRAM Double Data Rate 3 (DDR3). The DDR2 memory has an operating voltage of 1.8 Volt, while the DDR3 memory has an operating voltage of 1.5 volt and has a faster data transfer rate than the DDR2 memory.

Since the FB-DIMM interface to the system memory controller is the same for FB-DIMMs with DDR2 or DDR3 DRAM devices, it is desirable for the system to support either type of FB-DIMM even though the two types of memory devices require different operating voltages. In 102, system power is applied to the electronic system which in this illustrative example comprises a server. In 104, the DDR2/3 memory devices located on the FB-DIMMS coupled to the system are not powered up, while the EEPROM on the FB-DIMMs are powered up. After "powergood" status is achieved, the system processor(s) (see item 210 in FIG. 2) are removed from their reset condition in 106. Powergood status is achieved when the server determines that the system voltage level has stabilized to a predetermined level after system power-up.

In 108, the system's Basic Input/Output System (BIOS) is initialized. During the BIOS initialization in 110, the EEPROMs on the FB-DIMMS are queried via a serial system management interface. Although a serial interface is used in this illustrative example, other interfaces can be used to query the DIMMs. The query determines if the FB-DIMMs contain DDR2 or DDR3 memory devices, although in other embodiments, the query could determine between other memory device types.

If all the FB-DIMMs in the system are determined to contain DDR2 memory devices, the routine moves to 112 where a programmable voltage regulator in the server is set to the voltage level required for the DDR2 memory devices. The voltage regulator is set to the required voltage level by setting a voltage regulator input called Voltage ID (VID). If in 110, it is determined that system contains DDR3 memory devices, in 114, the programmable voltage regulator is set to the voltage level required for the DDR3 memory devices.

If in 110 it is determined that there is a mixture of DDR2 and DDR3 memory devices (e.g., one DIMM that is plugged into the server has DDR2 devices while another DIMM has DDR3 devices), in 120, the memory initialization is terminated and system operation is halted. As an optional feature, an audible and/or visual alarm (e.g., error light and/or audible signal) can be provided to the system operator. In 116, the voltage regulator output is enabled by sending an enable signal to the voltage regulator which in turn provides the appropriate voltage to the DIMMs. In 118, the rest of the BIOS initialization is completed and the system is booted.

Figure 2:
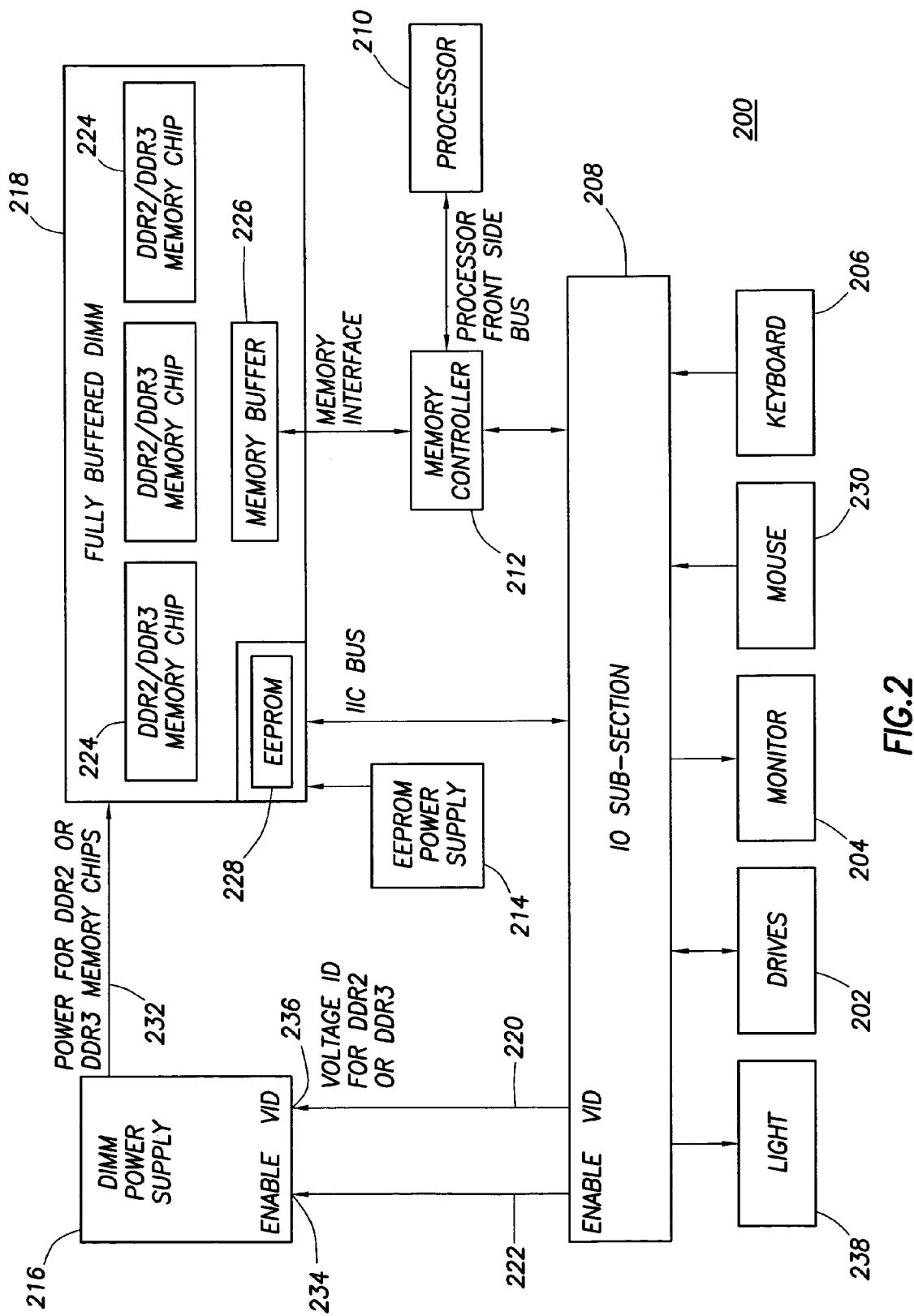
FIG. 2 shows a block diagram of an electronic device in accordance with an embodiment of the invention.

In FIG. 2, there is shown a partial block diagram of an electronic device such as a server 200 that can provide the multiple DIMM type support discussed above. Server 200 includes drives 202, a monitor 204, a mouse 230, a light 238 and keyboard 206 coupled to the server via an input/output sub-section 208. The input/output sub-section 208 can include the necessary hardware/software to perform the necessary I/O control functions.

A processor 210 is coupled to a memory controller 212 via a processor front side bus. The memory controller 212 is coupled to one or more FB DIMMs 218 via a memory interface. In other embodiments, where for example the memory controller function is integrated inside of the processor, the FB DIMMs 218 are coupled directly to the processor. The FB DIMM 218 includes one or more memory devices 224, a memory buffer 226 as previously described, and an EEPROM 228. The I/O sub-section 208 communicates with the EEPROM 228 via an IIC bus or other type of bus. Given that the EEPROM operates using a different voltage level (e.g., 2.5 volt) than the memory devices 224, it has its own power supply 214.

The DIMM(s) 218 are powered by a DIMM power supply 216 that includes a programmable output voltage 232 that is used to power the DIMM(s) 218. The programmable output voltage can be provided by a programmable voltage regulator. The DIMM power supply 216 includes an enable input 234 that enables the output 232 of the power supply to provide an output voltage. A VID input 236 receives a signal that instructs the DIMM power supply 216 what output voltage level is required. Both the enable and VID signals are provided via lines 222 and 220 respectively from the I/O sub-section 208.

The method of supplying a programmable voltage regulator with a VID that corresponds to the power supply voltage requirements of a particular memory technology (e.g., DDR2, etc.) provides many advantages to an electronic device such as a server 200. The method disclosed also can help prevent damaging DIMMs that are incorrectly installed, since before powering the DIMM(s) the system checks to see the type of memory device the DIMM(s) have installed.

The above discussion is meant to be illustrative of the principles and various embodiments of the present invention. Numerous variations and modifications will become apparent to those skilled in the art once the above disclosure is fully appreciated. For example, although DDR2 and DDR3 memory devices have been discussed, the invention can select from amongst 2 or more different memory devices that require different operating voltages. Also, although DIMM memory packages have been described, other memory packages can be supported, including memory types that are directly installed or plugged-in to a circuit board. In still another embodiment, two or more power regulators can be provided and appropriate switches included to allow various memory slots in a system to be electrically connected to different power regulators in response to the initial EEPROM query in 110 (see FIG. 1) in order to accommodate a mixed memory type system. It is intended that the following claims be interpreted to embrace all such variations and modifications.

What is claimed is:

1. A method, comprising:
   querying a memory to determine what operating voltage the memory requires; and
   applying the proper operating voltage to the memory based on the results of the query;
   wherein querying and applying are performed while initializing an electronic device.

2. The method as defined in claim 1, wherein the memory comprises a memory module that includes at least one memory device and a storage area that stores information regarding the at least one memory device, and the querying further comprises:
   powering up the storage area and not the at least one memory device to retrieve the information on the memory type.

3. The method as defined in 1, wherein applying the proper operating voltage comprises:
   programming a programmable voltage supply with the proper voltage to apply to the at least one memory device.

4. The method as defined in claim 3, further comprising:
   enabling an output of the programmable voltage supply so that applies the proper voltage to the at least one memory device.

5. An electronic device, comprising:
   at least one volatile memory device and a non-volatile storage area separate from the at least one volatile memory device, the storage area storing therein information regarding the at least one volatile memory device;
   a programmable power supply coupled to the at least one volatile memory device; and
   a controller that reads the information stored in the non-volatile storage area and, based on the information, programs the programmable power supply to apply the appropriate voltage to the at least one volatile memory device.

6. The electronic device as defined in claim 5, wherein the non-volatile storage area comprises an EEPROM.

7. The electronic device as defined in claim 5, further comprising a power supply coupled to the non-volatile storage area that supplies power to the non-volatile storage area.

8. The electronic device as defined in claim 5, wherein the at least one volatile memory device comprises a fully buffered dual in-line memory module (FB-DIMM).

9. The electronic device as defined in claim 5, wherein the electronic device comprises a server.

10. The electronic device as defined in claim 5, wherein the controller does not program the programmable power supply if the controller determines based, on the information read from the non-volatile storage area, that there are different types of volatile memory devices.

11. The electronic device as defined in claim 10, wherein the controller causes an error signal to be generated if there are different types of volatile memory devices.

12. A system, comprising:
a memory module including a plurality of memory devices and a non-volatile storage area for storing information about the plurality of memory devices;
means for reading the information in the storage area and for asserting a programming signal based on the information; and
means for selecting an operating voltage to the plurality of memory devices based on the programming signal.

13. The system as defined in claim 12, further comprising:
a second memory module including a plurality of memory devices; and
means for providing an error signal if the means for reading the information determines that the memory module and second memory module have different types of memory devices that require different operating voltages.

14. A server, comprising:
a memory module having a plurality of memory devices and a storage area for storing information about the plurality of memory devices;
a programmable power supply for providing a voltage to the plurality of memory devices; and
a controller for reading the information in the storage area and based on the information read, providing a signal to the programmable power supply so that it provides the proper voltage to the plurality of memory devices.

15. The server as defined in claim 14, further comprising:
a second memory module, the second memory module having a plurality of memory devices and a storage area for storing information about the plurality of memory devices.

16. The server as defined in claim 15, wherein the controller reads the storage area found in the memory module and the second memory module and if it determines that the memory modules have different types of memory devices, it does not allow the programmable power supply to supply a voltage to the memory modules.

17. The server as defined in claim 16, wherein the controller in response to determining that the memory modules have different memory devices causes an error signal to be generated.

18. The server as defined in claim 17, wherein the error signal comprises an audible and/or visual signal.

19. The server as defined in claim 14, wherein the memory module comprises a fully buffered dual in-line memory module (FB-DIMM).

* * * * *

UNITED STATES PATENT AND TRADEMARK OFFICE
CERTIFICATE OF CORRECTION

PATENT NO. : 7,327,612 B2 Page 1 of 1
APPLICATION NO. : 11/047196
DATED : February 5, 2008
INVENTOR(S) : Reza M. Bacchus, et al.

It is certified that error appears in the above-identified patent and that said Letters Patent is hereby corrected as shown below:

Column 4, line 30, in Claim 3, after "in" insert -- claim --.

Signed and Sealed this

Twenty-fourth Day of June, 2008

JON W. DUDAS
*Director of the United States Patent and Trademark Office*